(12) United States Patent
Fujieda et al.

(10) Patent No.: US 9,490,380 B2
(45) Date of Patent: Nov. 8, 2016

(54) METAL MATRIX COMPOSITE AND METHOD FOR PRODUCING THE SAME

(71) Applicant: Hitachi, Ltd., Tokyo (JP)

(72) Inventors: Tadashi Fujieda, Tokyo (JP); Takashi Naito, Tokyo (JP); Takuya Aoyagi, Tokyo (JP); Yuichi Sawai, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 14/379,208

(22) PCT Filed: Jan. 15, 2013

(86) PCT No.: PCT/JP2013/050506
§ 371 (c)(1),
(2) Date: Aug. 15, 2014

(87) PCT Pub. No.: WO2013/140832
PCT Pub. Date: Sep. 26, 2013

(65) Prior Publication Data
US 2015/0028333 A1    Jan. 29, 2015

(30) Foreign Application Priority Data

Mar. 21, 2012  (JP) ................................ 2012-063009

(51) Int. Cl.
| | |
|---|---|
| *H01L 31/032* | (2006.01) |
| *H01L 31/18* | (2006.01) |
| *C23D 5/00* | (2006.01) |
| *H02S 40/20* | (2014.01) |

(52) U.S. Cl.
CPC ............... *H01L 31/032* (2013.01); *C23D 5/00* (2013.01); *H01L 31/18* (2013.01); *H02S 40/20* (2014.12)

(58) Field of Classification Search
CPC .............................. H01L 31/032; H01L 31/18
USPC ....................................... 257/43, 467; 438/85
See application file for complete search history.

(56) References Cited

U.S. PATENT DOCUMENTS

| | | | |
|---|---|---|---|
| 7,208,773 B2 * | 4/2007 | Hatakeyama | .................. 257/99 |
| 2010/0180934 A1 * | 7/2010 | Naito et al. | .................. 136/252 |
| 2012/0161273 A1 | 6/2012 | Fujieda et al. | |
| 2012/0234391 A1 * | 9/2012 | Boussaad et al. | ............ 136/262 |
| 2012/0318559 A1 | 12/2012 | Aoyagi et al. | |

FOREIGN PATENT DOCUMENTS

| | | |
|---|---|---|
| JP | 2000-219976 A | 8/2000 |
| JP | 2004-002181 A | 1/2004 |
| JP | 2011-222873 A | 11/2011 |
| JP | 2011-241133 A | 12/2011 |
| WO | 2010/128679 A1 | 11/2010 |

* cited by examiner

*Primary Examiner* — Sheng Zhu
(74) *Attorney, Agent, or Firm* — Volpe and Koenig, P.C.

(57) ABSTRACT

A metal matrix composite having high corrosion resistance even if the coating film deposit amount is low is obtained. A metal matrix composite includes a metal or alloy substrate coated with a molten transition metal oxide glass, wherein the transition metal oxide glass has an n-type polarity. Further, a method for producing a metal matrix composite includes a step of applying a paste containing a transition metal oxide glass, an organic binder, and an organic solvent onto the surface of a metal or alloy substrate, and a step of forming a glass coating film on the substrate by heating to and maintaining a temperature equal to or higher than the softening point of the transition metal oxide glass after the application step, wherein the transition metal oxide glass has an n-type polarity.

5 Claims, 3 Drawing Sheets

METAL MATRIX COMPOSITE AND METHOD FOR PRODUCING THE SAME

TECHNICAL FIELD

The present invention relates to a metal matrix composite, in which a metal or an alloy is coated with a transition metal oxide semiconductor glass coating film, and a method for producing the same.

BACKGROUND ART

A light metal which is susceptible to oxidation such as aluminum or magnesium or an alloy thereof, or a transition metal such as iron or nickel or an alloy thereof is generally subjected to a surface treatment such as an anodizing treatment or a chemical conversion treatment for improving the corrosion resistance thereof.

The anodizing treatment is an anti-rust treatment in which a target metal is used as an anode in an electrolytic solution and a current is passed therethrough, whereby an oxide coating film is formed on the surface thereof.

The chemical conversion treatment is an anti-rust treatment in which a thin sulfide or oxide coating film is formed on the surface of a target metal in a solution by utilizing a chemical reaction such as sulfuration or oxidation. Examples thereof include a phosphate coating treatment which is a priming treatment for coating iron or steel, a chromate treatment which is a post-treatment of galvanization, and an iron blackening treatment.

On the other hand, in these treatments, a chromate, the use of which is largely restricted due to its harmfulness to the human body, and a fluoride, for which a wastewater treatment is difficult to increase the cost, are used, and so on, and therefore, a surface treatment method having a lower environmental load has been demanded.

PTL 1 discloses a steel plate subjected to a chromium-free treatment to impart heat resistance, in which a zinc alloy-plated steel plate substrate is coated with a coating film containing a liquid glass and at least one compound selected from at least a thiocarbonyl group-containing compound and a vanadate compound.

CITATION LIST

Patent Literature

PTL 1: JP-A-2000-219976

SUMMARY OF INVENTION

Technical Problem

However, the steel plate disclosed in PTL 1 has a problem that if the coating film deposit amount is low, the corrosion resistance is deteriorated.

An object of the invention is to obtain a metal matrix composite having high corrosion resistance even if the coating film deposit amount is low.

Solution to Problem

In order to achieve the above object, the invention is directed to a metal matrix composite in which a metal or alloy substrate is coated with a molten transition metal oxide glass, wherein the transition metal oxide glass has an n-type polarity.

Further, the invention is directed to a method for producing a metal matrix composite including a step of applying a paste containing a transition metal oxide glass, an organic binder, and an organic solvent onto the surface of a metal or alloy substrate, and a step of forming a glass coating film on the substrate by heating to and maintaining a temperature equal to or higher than the softening point of the transition metal oxide glass after the application step, wherein the transition metal oxide glass has an n-type polarity.

Advantageous Effects of Invention

According to the invention, a metal matrix composite having high corrosion resistance even if the coating film deposit amount is low can be obtained.

DESCRIPTION OF EMBODIMENTS

Figure 1:
FIG. 1 shows a cross-sectional view of a metal matrix composite in which the surface of a substrate alloy is coated with a glass.

Hereinafter, the invention will be described in detail.

The metal matrix composite of the invention is coated with a transition metal oxide semiconductor glass coating film. This glass coating film is composed mainly of a transition metal oxide, and the ratio of the number of high-valent transition metal ions to the number of low-valent transition metal ions is adjusted to be larger than 1. When the ratio of the number of high-valent transition metal ions to the number of low-valent transition metal ions is larger than 1, the glass shows an n-type semiconductor property. An n-type glass has an activity of reducing a substrate metal, and also has favorable wettability to a metal, and therefore can strongly adhere to a metal even if there is no layer which plays a role in adhesion such as an oxide layer, and improves corrosion resistance. Incidentally, in the invention, the term "metal" encompasses both metal simple substance and alloy.

In the case of vanadium among the transition metals, particularly the wettability to a metal is favorable. The ratio of the number of pentavalent vanadium ions to the number of tetravalent vanadium ions in the glass can be adjusted only by vanadium oxide, however, the adjustment is facilitated by adding another element. In other words, it is only necessary that the number of pentavalent vanadium ions is larger than the number of tetravalent vanadium ions. Incidentally, the valence of the vanadium ion in the glass can be measured by redox titrimetry according to JIS-G 1221. In order to satisfy the following relationship: $[V^{5+}]/[V^{4+}]>1$, it is only necessary to add at least one or more elements which have an effect of suppressing the reduction of vanadium pentoxide ($V_2O_5$) selected from copper, silver, an alkali metal, and an alkaline earth metal.

Further, by adding an element having a relatively large ionic radius such as valium or tungsten or iron in addition to tellurium or phosphorus, which is a vitrifying component, the water content in the glass or the air permeability of the glass can be significantly decreased. According to this, by forming a glass coating film on the surface of a metal, the corrosion resistance of the metal is significantly improved.

Further, this glass coating film is black and has a property of absorbing light in a wavelength range from ultraviolet to near-infrared light (200 to 1500 nm), and therefore, it is not necessary to color the glass coating film when it is formed, and the metal matrix composite of the invention can also be applied to a light absorber.

Further, the glass coating film is formed on a metal by applying a paste composed of a transition metal oxide semiconductor glass powder, an organic binder, and an organic solvent onto the surface of a metal serving as a substrate, and then heating to and maintaining a temperature equal to or higher than the softening point of the glass. The invention is not configured such that a glass plate is laminated on a metal, but is configured such that the surface of a metal is coated with a molten glass coating film. In general, the wettability between a glass and a metal is poor and they cannot adhere to each other. However, according to the invention, the glass has an n-type polarity, and has favorable wettability to a metal and can adhere thereto, and therefore, a metal matrix composite having high corrosion resistance can be produced. Further, since chromium is not used unlike the conventional techniques, the environmental load is low, and thus, the cost can be reduced due to a simplified process.

(Production of Transition Metal Oxide Semiconductor Glass)

A platinum crucible containing 200 g of a mixed powder obtained by blending and mixing $V_2O_5$, $P_2O_5$, BaO, $Te_2O_2$, $K_2O$, and $WO_3$ at a weight ratio of 38.0%, 5.8%, 11.2%, 30.0%, 5.0%, and 10.0%, respectively, was heated in an electric furnace. The temperature rising rate was set to 5° C./min, and when a target temperature (800 to 900° C.) was reached, the temperature was maintained for 1 hour by heating while stirring the glass. Thereafter, the platinum crucible was taken out from the melting furnace, and the molten mixture was casted in a graphite mold which was heated to and maintained at 150 to 300° C. in advance. The obtained glass block was ground, and the characteristic points of the glass were measured by a differential thermal analysis (DTA). The glass transition point (Tg) was 276° C., the yield point (Mg) was 293° C., and the softening point (Ts) was 336° C.

(Formation of Transition Metal Oxide Semiconductor Glass Coating Film)

The produced glass was ground to a powder having a size of 10 μm or less, and a mixed solution containing ethyl cellulose (EC) and butyl carbitol acetate (BCA) was blended therein in an amount of 15 wt % with respect to the amount of the powder, whereby a paste was formed. This glass paste was applied onto the surface of a substrate metal 101 such as an aluminum (Al) alloy plate or a magnesium (Mg) alloy plate by a screen printing method, a spray coating method, or the like, followed by heating to about 150° C. to remove butyl carbitol acetate. Thereafter, the substrate was heated to and maintained at 420° C. which is equal to or higher than the softening point of the glass for 10 minutes in the air, whereby ethyl cellulose was removed, and also the glass powder was fused. By doing this, as shown in FIG. 1, the surface of the substrate metal 101 could be coated with a transition metal oxide semiconductor glass coating film 102.

Further, if the glass coating film is thick and has a thickness of about several tens of micrometers or more, due to a difference in thermal expansion between the glass and the substrate metal, a crack may occur in the glass coating film or the glass coating film may be detached from the substrate metal. In order to prevent these, a ceramic or metal filler for controlling thermal expansion is added to the glass paste, so that the thermal expansion of the glass coating film can be brought closer to that of the substrate metal.

Figure 2:
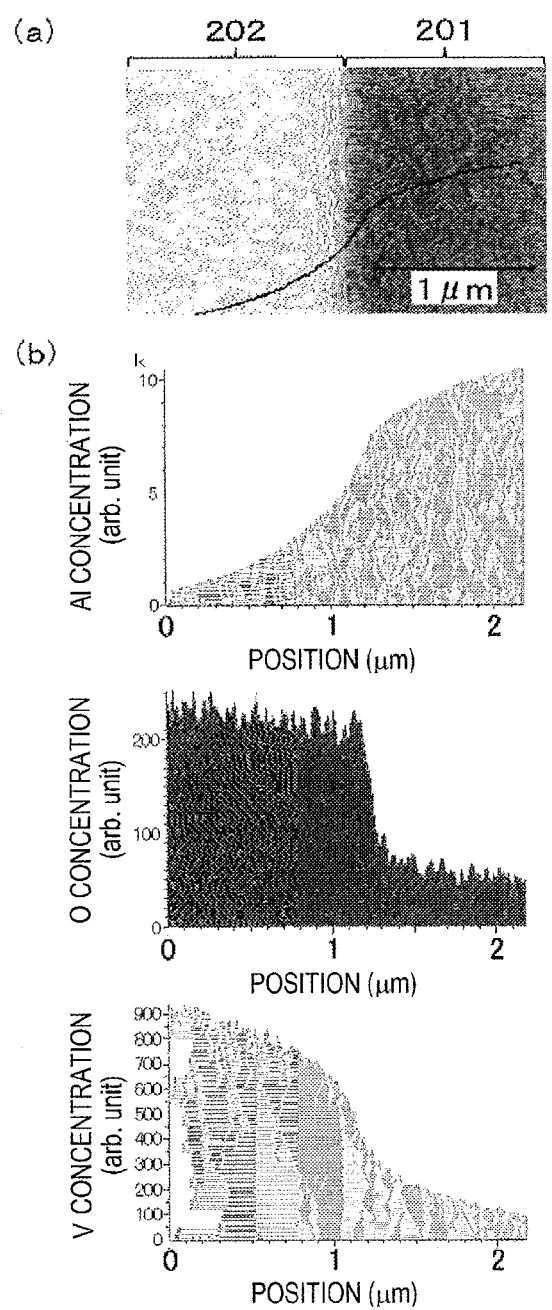
FIG. 2 shows a scanning electron micrograph of the cross section of an aluminum matrix composite in which the surface of an aluminum alloy is coated with a glass in the vicinity of the interface, and the concentration profiles of aluminum, oxygen, and vanadium.

FIG. 2 shows the results of the structure observation (a) and the composition analysis (b) of the cross section of an Al matrix composite in which the surface of an Al alloy is coated with a glass in the vicinity of the interface using a scanning electron microscope (SEM) and an energy dispersive X-ray spectroscope (EDS). Based on the drawing of (a), no crack is observed at the interface between an Al alloy 201 and a glass coating film 202. Further, based on the drawing of (b), an oxide layer is not observed in the vicinity of the interface, and it is found that Al and V, which are the main components of both members, are mutually diffused. According to these results, it is found that the Al alloy 201 and the glass coating film 202 are strongly adhered to each other.

Figure 3:
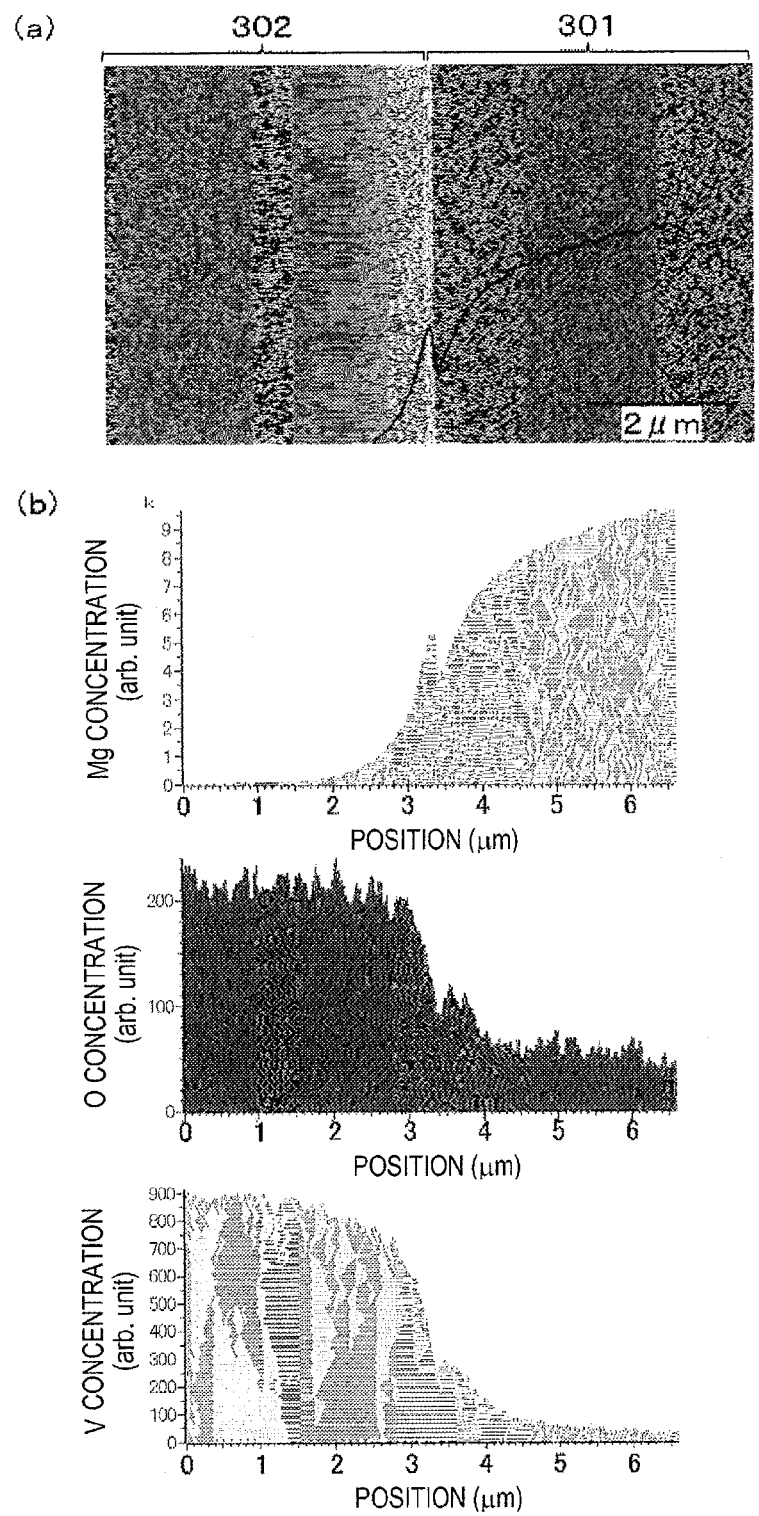
FIG. 3 shows a scanning electron micrograph of the cross section of a magnesium matrix composite in which the surface of a magnesium alloy is coated with a glass in the vicinity of the interface, and the concentration profiles of magnesium, oxygen, and vanadium.

FIG. 3 shows the results of the structure observation (a) and the composition analysis (b) of the cross section of a Mg matrix composite in which the surface of a Mg alloy is coated with a glass in the vicinity of the interface using a scanning electron microscope (SEM) and an energy dispersive X-ray spectroscope (EDS). Similarly to the above, based on the drawing of (a), no crack is observed at the interface between a Mg alloy 301 and a glass coating film 302. Further, based on the drawing of (b), an oxide layer is not observed in the vicinity of the interface, and it is found that Mg and V, which are the main components of both members, are mutually diffused. According to these results, it is found that the Mg alloy 301 and the glass coating film 302 are strongly adhered to each other.

Incidentally, it was confirmed that a substrate can be coated with a glass coating film in the same manner also in the case of iron, steel, a nickel alloy, and the like other than the case where an Al alloy or a Mg alloy is used as the material of the substrate.

(Evaluation of Corrosion Resistance)

A saturated pressure cooker test (PCT) was performed for a test piece in which the entire surface of an Al alloy plate was coated with a glass. Incidentally, the thickness of the glass coating film was about 3 μm, and the PCT conditions were as follows: temperature: 120° C., humidity: 100% RH, pressure: 202 kPa, and time: 50 hr.

As a result of inspection of the outer appearance after the PCT test, no change was observed on the glass surface.

(Evaluation of Light Absorption Property)

Figure 4:
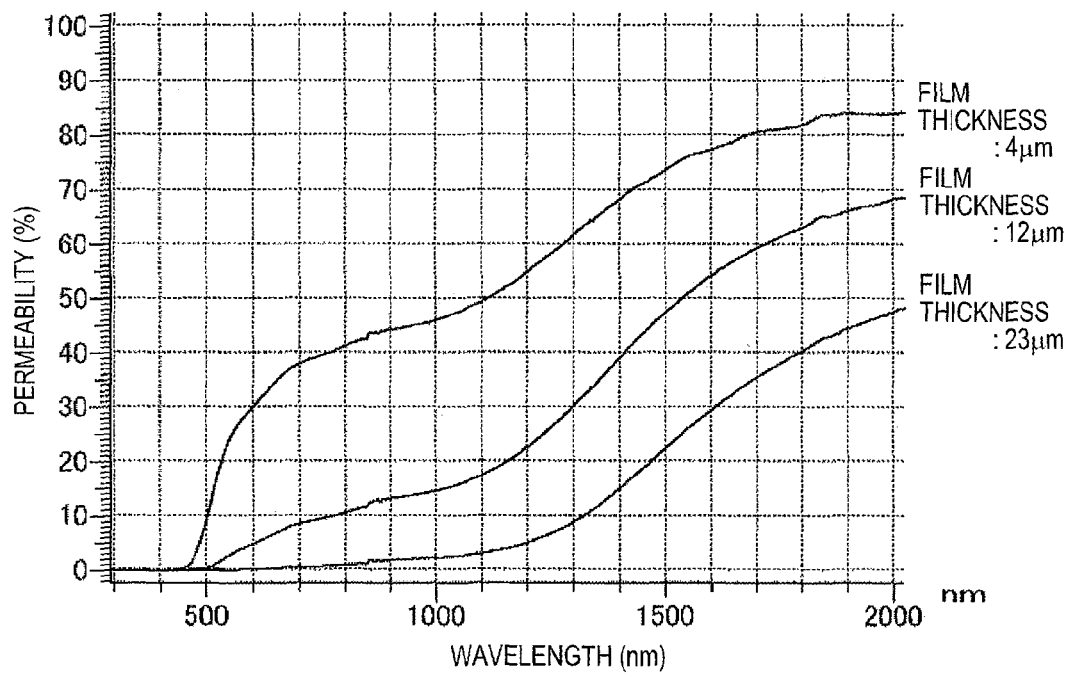
FIG. 4 shows the spectroscopic properties of glass coating films.

FIG. 4 shows the results of the measurement of the spectroscopic properties of glasses by a spectrophotometer after forming transition metal oxide semiconductor glass coating films of various thicknesses on the surfaces of quartz substrates. Incidentally, the measurement wavelength was set to 240 to 2400 nm, and the spectroscopic property of a quartz substrate which was not coated with a glass was used as a reference. By doing this, it is found that the glass coating film absorbs light in a wavelength range from ultraviolet to near-infrared light. Therefore, a metal or an alloy coated with a glass becomes a light absorber having excellent corrosion resistance and heat resistance.

(Bonding of Heterogeneous Materials)

The transition metal oxide semiconductor glass to be used in the invention has favorable adhesiveness to ceramics of alumina, silicon nitride, quartz glass, and the like, and therefore can be used as an adhesive for bonding a metal or an alloy to a ceramic.

Further, this transition metal oxide semiconductor glass can also be used as an adhesive for heterogeneous metals or alloys.

REFERENCE SINGS LIST

101 substrate metal
102, 202, 302 glass coating film
201 Al alloy
301 Mg alloy

The invention claimed is:

1. A metal matrix composite comprising a metal or alloy substrate in a reduced state coated with a molten transition metal oxide glass, wherein the transition metal oxide glass has an n-type semiconductor polarity and directly adheres to the reduced metal or alloy substrate, wherein the transition metal oxide glass contains vanadium, and the vanadium in the transition metal oxide satisfies a valence ratio relationship of $[V^{5+}]/[V^{4+}]>1$.

2. The metal matrix composite according to claim 1, wherein the number of high-valent transition metal ions contained in the transition metal oxide glass is larger than the number of low-valent transition metal ions.

3. The metal matrix composite according to claim 1, wherein the reduced metal or alloy substrate is made of aluminum, magnesium, or an alloy thereof.

4. The metal matrix composite according to claim 1, wherein the transition metal oxide glass contains at least one of tellurium and phosphorus and at least one of silver, iron, tungsten, copper, an alkali metal, and an alkaline earth metal.

5. The metal matrix composite according to claim 1, wherein the transition metal oxide glass absorbs light in a wavelength range from ultraviolet to near-infrared light.

* * * * *